US012173966B2

(12) United States Patent
Kubo et al.

(10) Patent No.: US 12,173,966 B2
(45) Date of Patent: Dec. 24, 2024

(54) COOLING DEVICE

(71) Applicant: FUJITSU LIMITED, Kawasaki (JP)

(72) Inventors: Hideo Kubo, Kawasaki (JP); Atsushi Endo, Kawasaki (JP); Masahide Kodama, Kawasaki (JP); Shinnosuke Fujiwara, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 290 days.

(21) Appl. No.: 17/181,737

(22) Filed: Feb. 22, 2021

(65) Prior Publication Data

US 2021/0372707 A1  Dec. 2, 2021

(30) Foreign Application Priority Data

May 26, 2020 (JP) .................................. 2020-091716

(51) Int. Cl.
*F28D 15/02* (2006.01)
*F28D 21/00* (2006.01)
*H01L 23/427* (2006.01)

(52) U.S. Cl.
CPC ..... *F28D 15/0266* (2013.01); *F28D 15/0275* (2013.01); *H01L 23/427* (2013.01); *F28D 2021/0028* (2013.01); *F28D 2021/0071* (2013.01)

(58) Field of Classification Search
CPC ............. F28D 15/0266; F28D 15/0275; F28D 2021/0028; F28D 2021/0071; F28D 15/04; F28D 15/046; H01L 23/427
See application file for complete search history.

(56) References Cited

U.S. PATENT DOCUMENTS

| 4,640,347 | A  | * | 2/1987 | Grover .................. F28D 15/025 |
|           |    |   |        | 165/104.21 |
| 6,650,544 | B1 | * | 11/2003 | Lai ........................ F28D 15/046 |
|           |    |   |        | 174/15.2 |
| 7,891,413 | B2 | * | 2/2011 | Liu ........................ F28D 15/046 |
|           |    |   |        | 29/890.032 |
| 10,297,524 | B2 | * | 5/2019 | Watanabe ........... H01L 21/4882 |
| 2009/0040726 | A1 | * | 2/2009 | Hoffman ............. F28D 15/0233 |
|           |    |   |        | 29/890.032 |

(Continued)

FOREIGN PATENT DOCUMENTS

| JP | 10-209356 A | 8/1998 |
| JP | 6647439 | 2/2020 |

(Continued)

OTHER PUBLICATIONS

Japanese Office Action issued in counterpart of Japanese Application No. 2020-091716 dated Nov. 14, 2023.

*Primary Examiner* — Tavia Sullens
*Assistant Examiner* — Khaled Ahmed Ali Al Samiri
(74) *Attorney, Agent, or Firm* — STAAS & HALSEY LLP

(57) ABSTRACT

A cooling device includes a vessel having a refrigerant sealed inside, an evaporator that receives heat to evaporate a liquid phase of the refrigerant inside the vessel, a condenser that dissipates heat to condense a vapor phase of the refrigerant inside the vessel, a tube shaped transporter that transports the liquid-phase refrigerant inside the vessel to the evaporator by capillary action, and a gap generator that generates a gap between the transporter and the evaporator for the liquid-phase refrigerant to move from the transporter to the evaporator.

18 Claims, 21 Drawing Sheets

(56) References Cited

U.S. PATENT DOCUMENTS

| | | | |
|---|---|---|---|
| 2011/0297355 A1* | 12/2011 | Meyer, IV | ............ H01L 23/427 |
| | | | 165/104.26 |
| 2014/0138059 A1* | 5/2014 | Ambrose | ............ F28D 15/0275 |
| | | | 165/104.26 |
| 2014/0165638 A1 | 6/2014 | Yoshikawa et al. | |
| 2019/0075682 A1 | 3/2019 | Shioga et al. | |
| 2020/0400379 A1 | 12/2020 | Watanabe et al. | |

FOREIGN PATENT DOCUMENTS

| WO | WO 2013/018667 A1 | 2/2013 |
|---|---|---|
| WO | WO 2017/195254 A1 | 11/2017 |

* cited by examiner

COOLING DEVICE

CROSS-REFERENCE TO RELATED APPLICATION

This application is based upon claims the benefit of priority of the prior Japanese Patent Application No. 2020-091716, filed on May 26, 2020 the entire contents of which are incorporated herein by reference.

FIELD

The embodiments discussed herein are related to a cooling device.

BACKGROUND

In boiling coolers that cool a heat-emitting body such as a semiconductor element, structures exist in which columnar members for condensing refrigerant are densely arranged in a closed boiling region so as to increase surface area for heat dissipation and thus improve heat dissipation properties.

Loop heat pipes also exist that have a structure in which two plate shaped members provided with plural recesses and plural protrusions oppose each other in a region configuring an evaporator so as to generate a strong capillary force between the plate shaped members.

Moreover, in cooling devices that cyclically change phases of a refrigerant by vaporization and condensation, structures exist in which an evaporator is provided with an evaporator vessel and a dividing wall to partition refrigerant contained within the evaporator vessel. The height of the dividing wall is at least the height of a vapor-liquid interface of the refrigerant but less than the height of the evaporator vessel.

RELATED PATENT DOCUMENTS

Japanese Patent Application Laid-Open (JP-A) No. H10-209356
International Publication (WO) No. 2017/195254
WO No. 2013/018667

SUMMARY

According to an aspect of the embodiments, a cooling device includes a vessel having a refrigerant sealed inside, an evaporator that receives heat to evaporate a liquid phase of the refrigerant inside the vessel, a condenser that dissipates heat to condense a vapor phase of the refrigerant inside the vessel, a tube shaped transporter that transports the liquid-phase refrigerant inside the vessel to the evaporator by capillary action, and a gap generator that generates a gap between the transporter and the evaporator for the liquid-phase refrigerant to move from the transporter to the evaporator.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Detailed explanation follows regarding a cooling device 42 of a first exemplary embodiment, with reference to the drawings.

Figure 1:
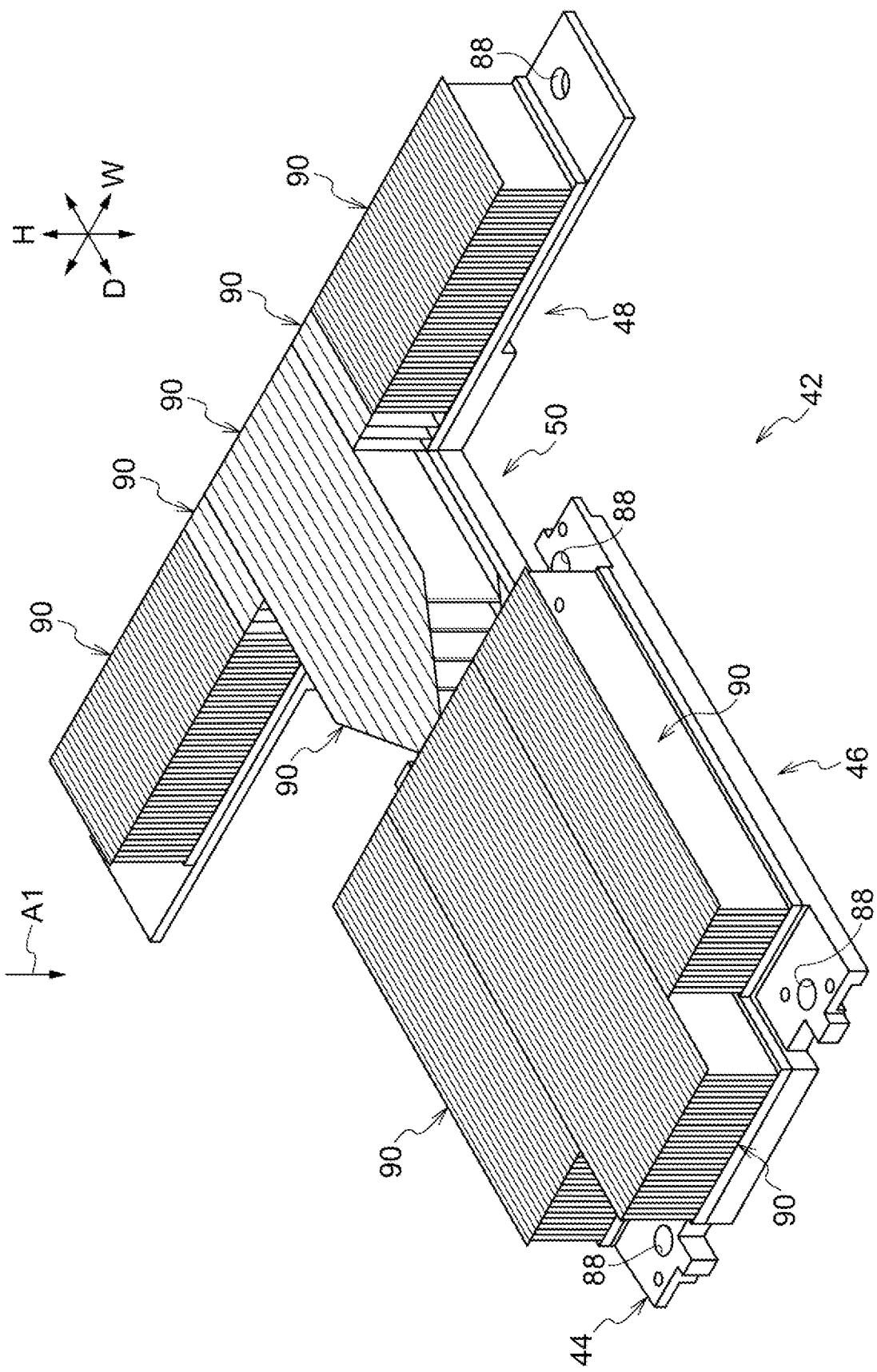
FIG. 1 is a perspective view illustrating a cooling device of a first exemplary embodiment.
Figure 2:
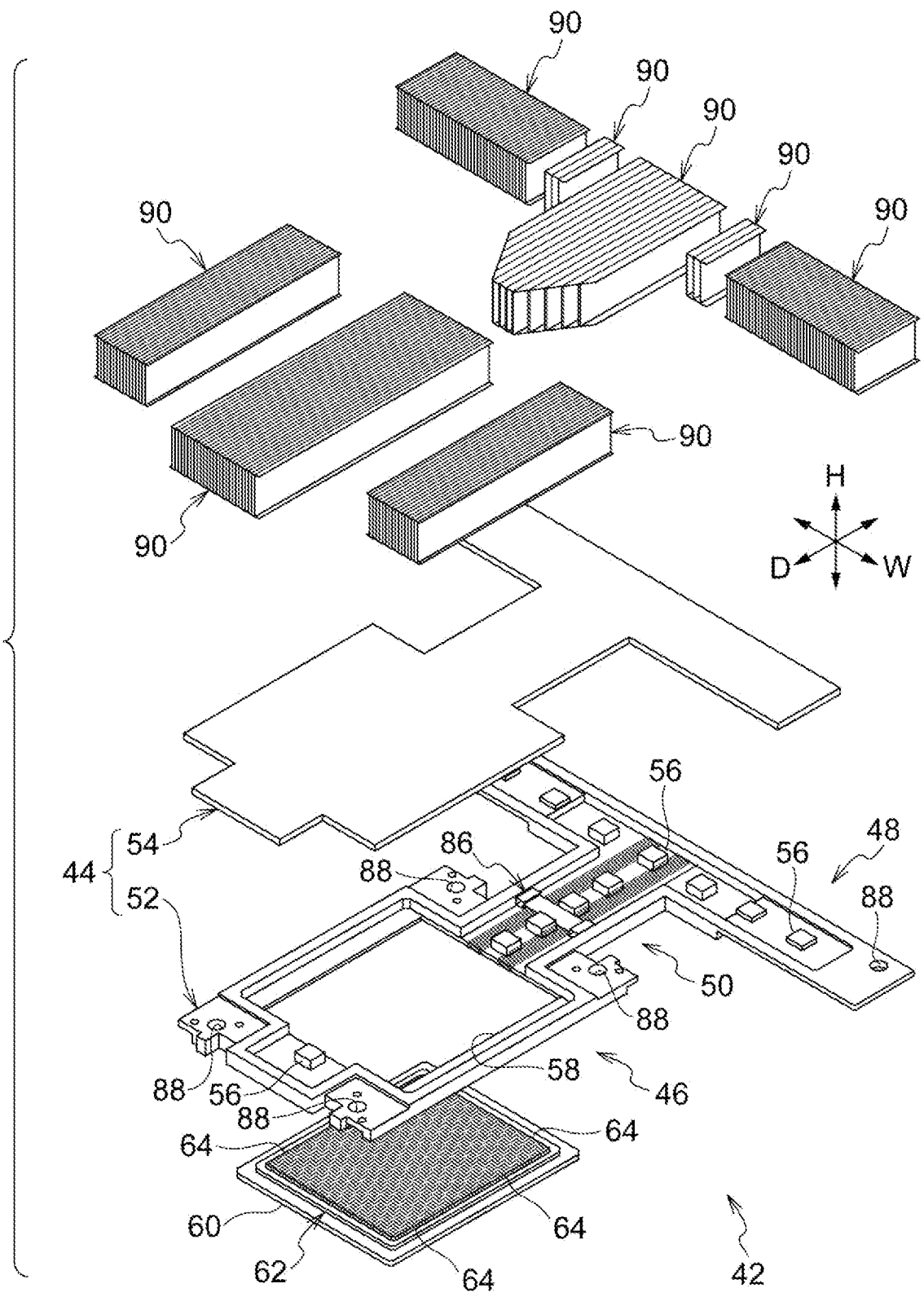
FIG. 2 is an exploded perspective view illustrating a cooling device of the first exemplary embodiment.
Figure 3:
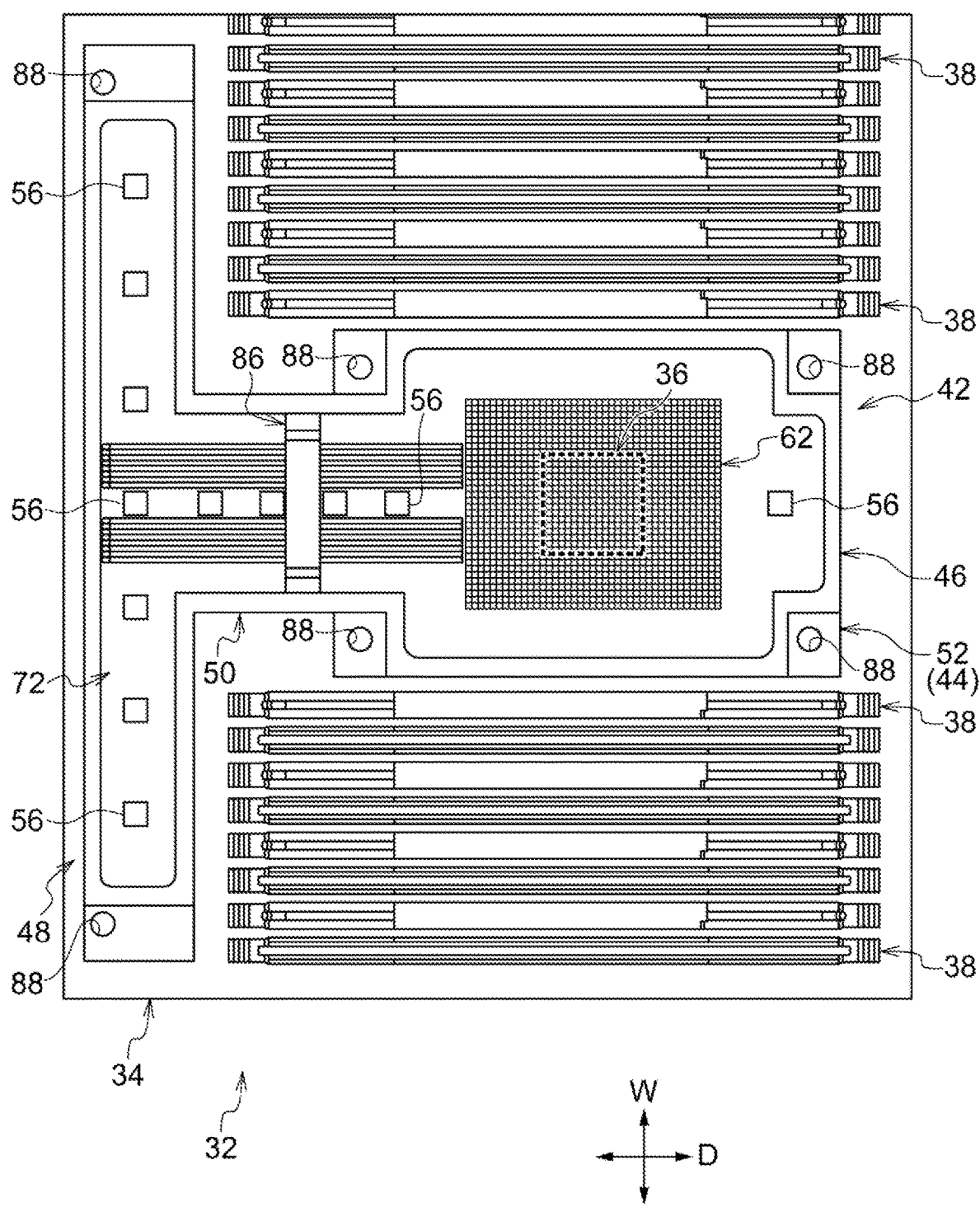
FIG. 3 is a partial plan view illustrating an electronic device provided with a cooling device of the first exemplary embodiment together with an internal structure of the cooling device.

FIG. 1 and FIG. 2 illustrate the cooling device 42 of the first exemplary embodiment. FIG. 3 illustrates an electronic unit 32 provided with the cooling device 42. As an example, the electronic unit 32 may be an information communication device such as a server, although there is no limitation thereto.

The electronic unit 32 includes a substrate 34 that is rigid and has insulating properties. Plural elements 36, 38 are mounted on the substrate 34. The types of the elements 36, 38 are not particularly limited. In the example illustrated in FIG. 3, the element 36 is a processor chip and the elements 38 are memory chips. In this case, the element 36 is an example of a heat-emitting body. The cooling device 42 is disposed in contact with the element 36 in order to cool the element 36.

As illustrated in FIG. 1 to FIG. 5, the cooling device 42 includes a vessel 44. A refrigerant RF (see FIG. 5) is sealed inside the vessel 44. The cooling device 42 further includes a heat receiving section 46, a heat dissipating section 48, and a connection section 50.

The type of the refrigerant RF is not limited as long as the refrigerant RF is capable of moving heat by circulating while undergoing phase transitions between a liquid phase and a gaseous phase inside the vessel 44. For example, water may be employed as the refrigerant RF. Although an oil or alcohol may be employed as an alternative to water, water is employed in the present exemplary embodiment due to its ready availability and ease of handling.

As illustrated in FIG. 3, the heat receiving section 46 is a section that is disposed in contact with the element 36 so as to receive heat from the element 36. The heat receiving section 46 includes an evaporator 62 that vaporizes the liquid-phase refrigerant RF with this heat.

The heat dissipating section 48 is a section that is disposed apart from the heat receiving section 46, and that releases heat in the refrigerant RF sealed in the vessel 44 to the exterior. The heat dissipating section 48 includes a condenser 72 to liquefy the vapor-phase refrigerant RF by heat dissipation.

The connection section 50 is a section connecting the heat receiving section 46 and the heat dissipating section 48 together. The connection section 50 also configures a movement region 74 through which the refrigerant RF moves between the evaporator 62 and the condenser 72. Note that some of the heat of the refrigerant RF when in the vapor phase state is expelled to the exterior of the connection section 50, thus liquefying the refrigerant RF.

In the drawings, a width direction, depth direction, and height direction of the vessel 44 are respectively indicated by an arrow W, an arrow D, and an arrow H. In the present exemplary embodiment, the heat dissipating section 48 has a shape that is broader in the width direction but shorter in the depth direction than the heat receiving section 46. The connection section 50 is narrower in the width direction than the heat receiving section 46, but has sufficient depth to connect the heat receiving section 46 and the heat dissipating section 48 together.

As illustrated in FIG. 2, the vessel 44 has a structure in which two plate members, namely a bottom plate 52 and a top plate 54, are fixed in a state overlapping each other in a thickness direction (height direction).

Plural support columns 56 extend upward from the bottom plate 52. Leading ends (upper ends) of the support columns 56 contact the top plate 54, such that the top plate 54 is supported by the support columns 56. The interior of the vessel 44 is maintained in a low pressure state. Even in this low pressure state, a separation between the top plate 54 and the bottom plate 52 is maintained by the support columns 56, and the interior volume of the vessel 44 is secured.

Figure 4:
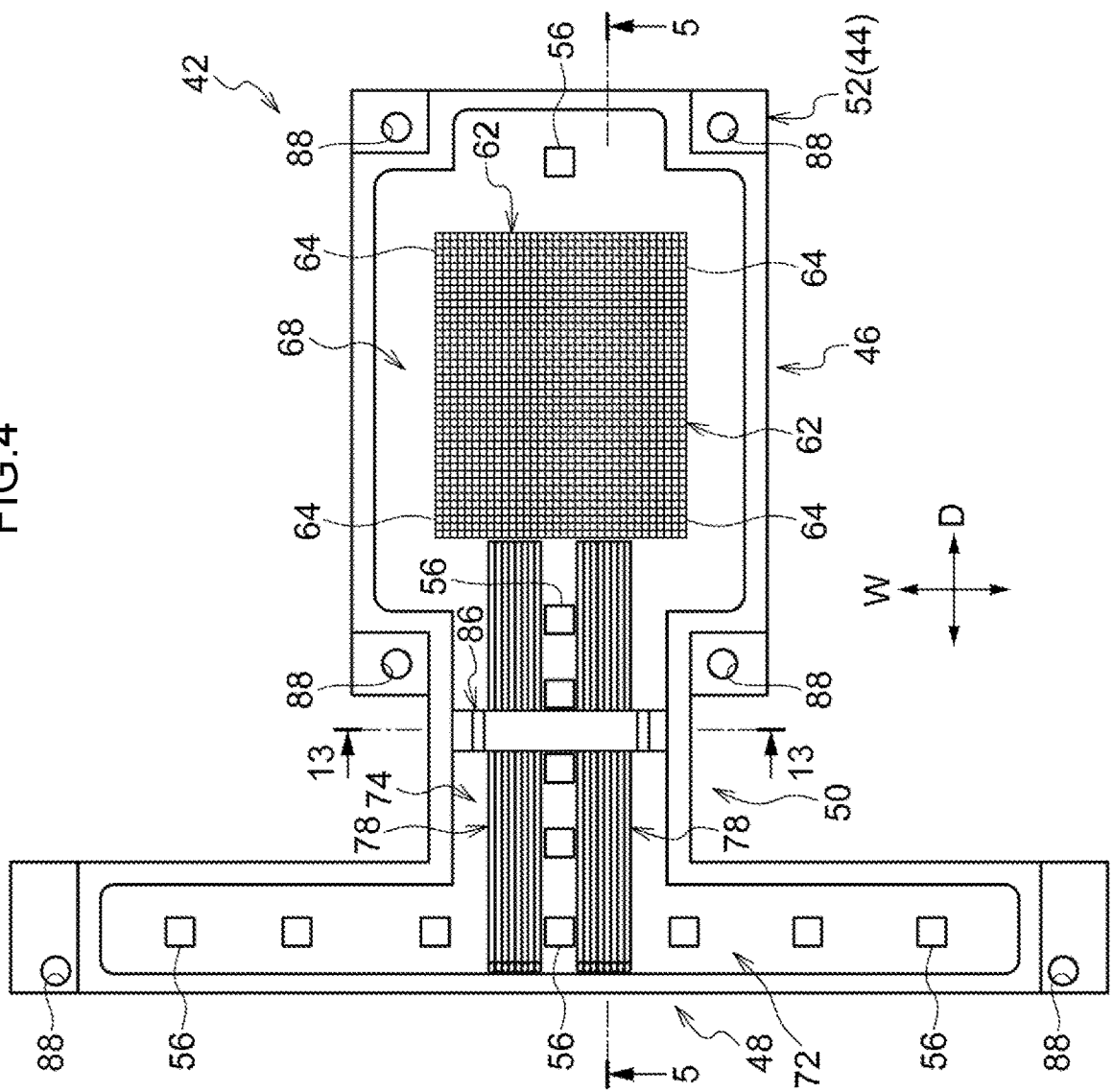
FIG. 4 is a plan view illustrating an internal structure of a cooling device of the first exemplary embodiment.

As illustrated in FIG. 2 and FIG. 4, in the present exemplary embodiment, plural of the support columns 56 are disposed at intervals in the width direction of the vessel 44 in the heat dissipating section 48. Moreover, plural of the support columns 56 are disposed at intervals in the depth direction of the vessel 44 in the connection section 50. Furthermore, a single support column 56 is provided in the heat receiving section 46 on the opposite side to the connection section 50, such that the evaporator 62 lies therebetween.

As illustrated in FIG. 2, an opening 58 is formed in the bottom plate 52 at a portion corresponding to the heat receiving section 46. A heat receiving plate 60 is fitted into this opening 58 so as to attain a sealed structure of the vessel 44 configured by the bottom plate 52, the top plate 54, and the heat receiving plate 60.

Plural columnar members 64 extend upward toward the top plate 54 from the heat receiving plate 60. As illustrated in detail in FIG. 5 to FIG. 7, the plural columnar members 64 are disposed at uniform intervals in the width direction and the depth direction. A grooved section 66 is formed in a lattice shape between the columnar members 64. A groove width W1 of the grooved section 66 is narrower than an internal diameter N1 of transport pipes 78, described later.

Figure 11:
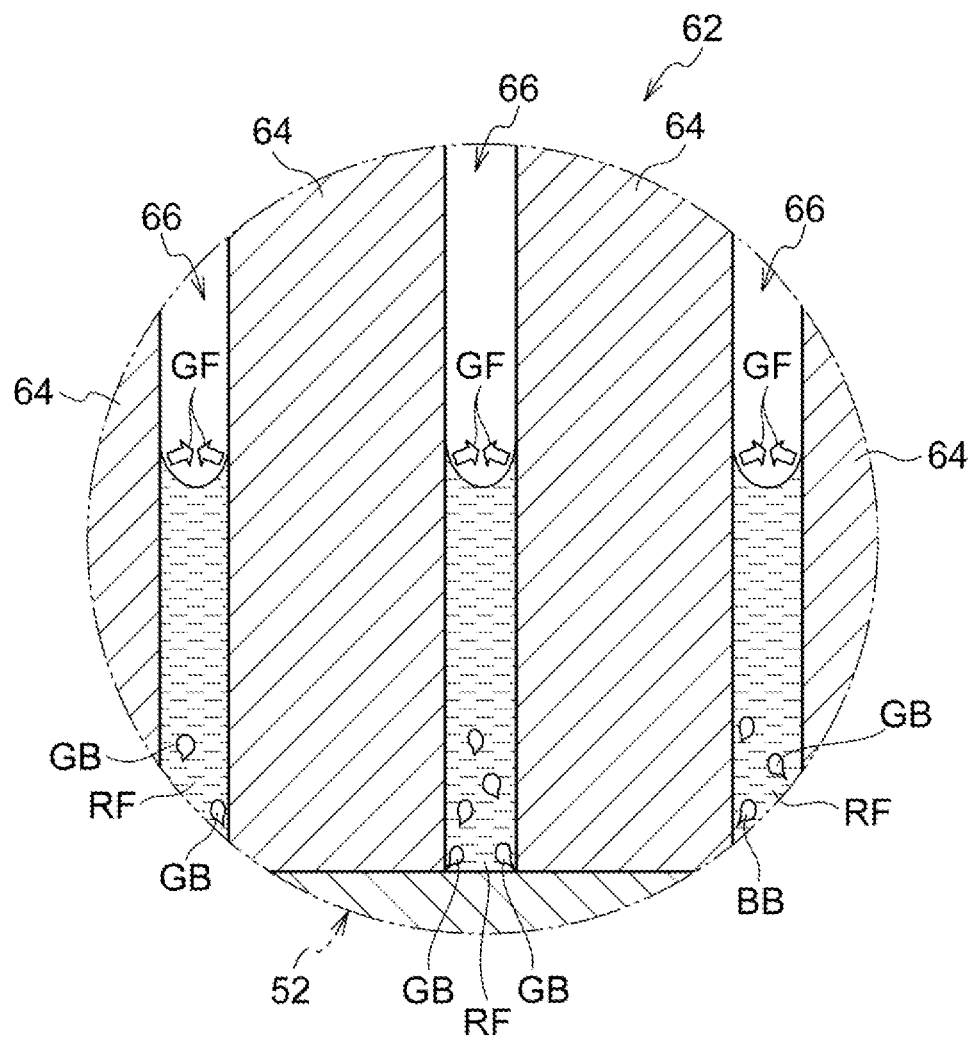
FIG. 11 is a cross-section illustrating a state in which a refrigerant is evaporating in a cooling device of the first exemplary embodiment.

As illustrated in FIG. 11, the grooved section 66 promotes vaporization of the liquid-phase refrigerant RF using heat from the heat receiving section 46. "Vaporization" here includes boiling in which the refrigerant RF vaporizes from within as illustrated by gas bubbles GB, in addition to evaporation in which the refrigerant RF vaporizes from its surface as illustrated by the arrows GF. In the following explanation, these phenomena are collectively referred to as evaporation. The location provided with the columnar members 64 is a location where the liquid-phase refrigerant RF evaporates in this manner, and thus configures the evaporator 62.

Leading ends of the columnar members 64 contact the top plate 54. This maintains the separation between the top plate 54 and the bottom plate 52 and secures the interior volume of the vessel 44 in the low pressure state of the interior of the vessel 44.

As illustrated in FIG. 4, a dispersion region 68 is formed between the top plate 54 and the bottom plate 52 at the periphery of the columnar members 64. Vapor-phase refrigerant RF evaporated in the evaporator 62 is dispersed in the dispersion region 68.

The movement region 74 is formed between the top plate 54 and the bottom plate 52 between the heat receiving section 46 and the heat dissipating section 48. Vapor-phase refrigerant RF evaporated in the evaporator 62 moves through the movement region 74 toward the heat dissipating section 48. During this movement, heat of the refrigerant RF is expelled to the exterior of the vessel 44, causing the vapor-phase refrigerant RF to condense and liquefy. Namely, the connection section 50 and the heat dissipating section 48 are sections in which the vapor-phase refrigerant RF condenses in this manner.

Figure 12:
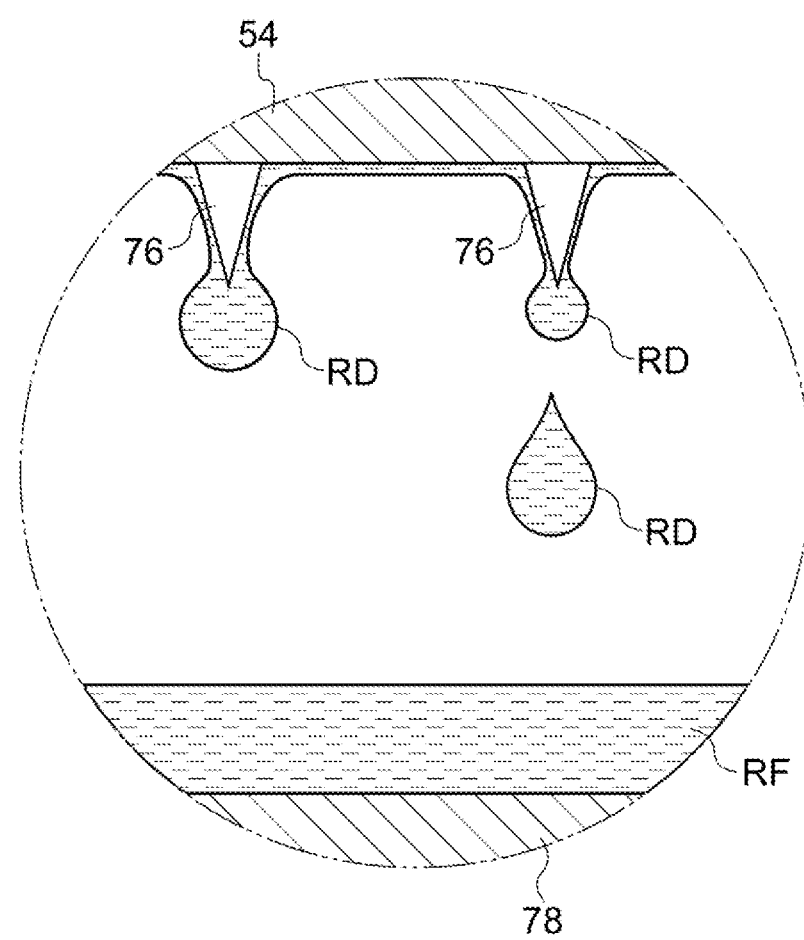
FIG. 12 is a cross-section illustrating a state in which a refrigerant is condensing in a cooling device of the first exemplary embodiment.

As illustrated in FIG. 12, plural projections 76 are formed on the top plate 54 so as to project toward the bottom plate 52. Each of the projections 76 has a tapered shape on progression toward its leading end side. Providing these projections 76 increases the surface area of an upper face of the condenser 72 in comparison to structures in which the projections 76 are not present.

Figure 5:
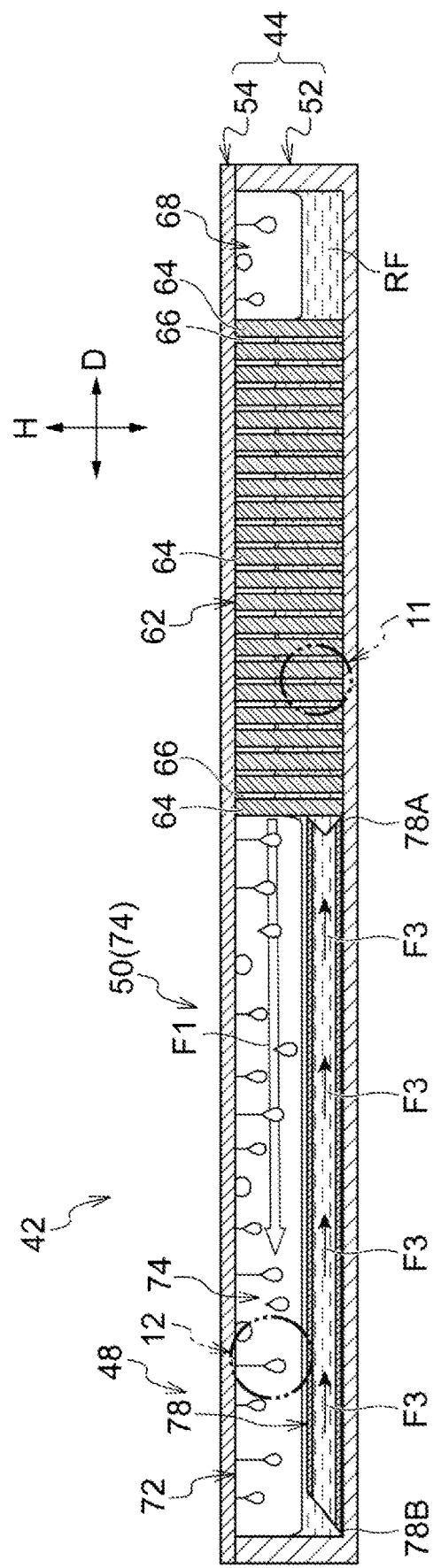
FIG. 5 is a cross-section sectioned along line 5-5 in FIG. 4, illustrating a state in which a cooling device of the first exemplary embodiment is not tilted.
Figure 6:
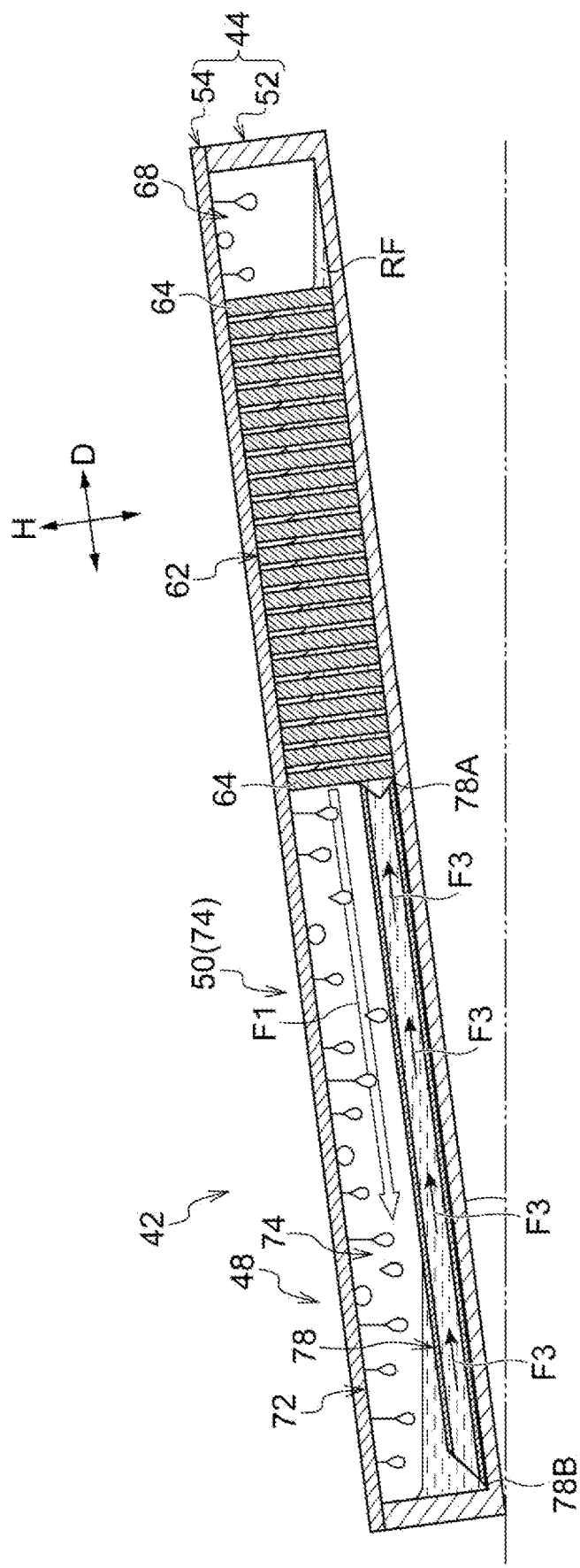
FIG. 6 is a cross-section illustrating a state in which a cooling device of the first exemplary embodiment is tilted.

As illustrated in FIG. 4 to FIG. 6, the transport pipes 78 are disposed extending in the depth direction inside the vessel 44. Although just a single transport pipe 78 may be provided, in the example of the present exemplary embodiment, plural of the transport pipes 78 are provided (in the example illustrated in FIG. 13, two sets each including eight of the transport pipes 78 arranged adjacent to each other in the width direction are disposed on either side of the support columns 56 to give a total of sixteen of the transport pipes 78). The length direction of the transport pipes 78 is aligned with the depth direction of the vessel 44 (the arrow D direction).

Figure 7:
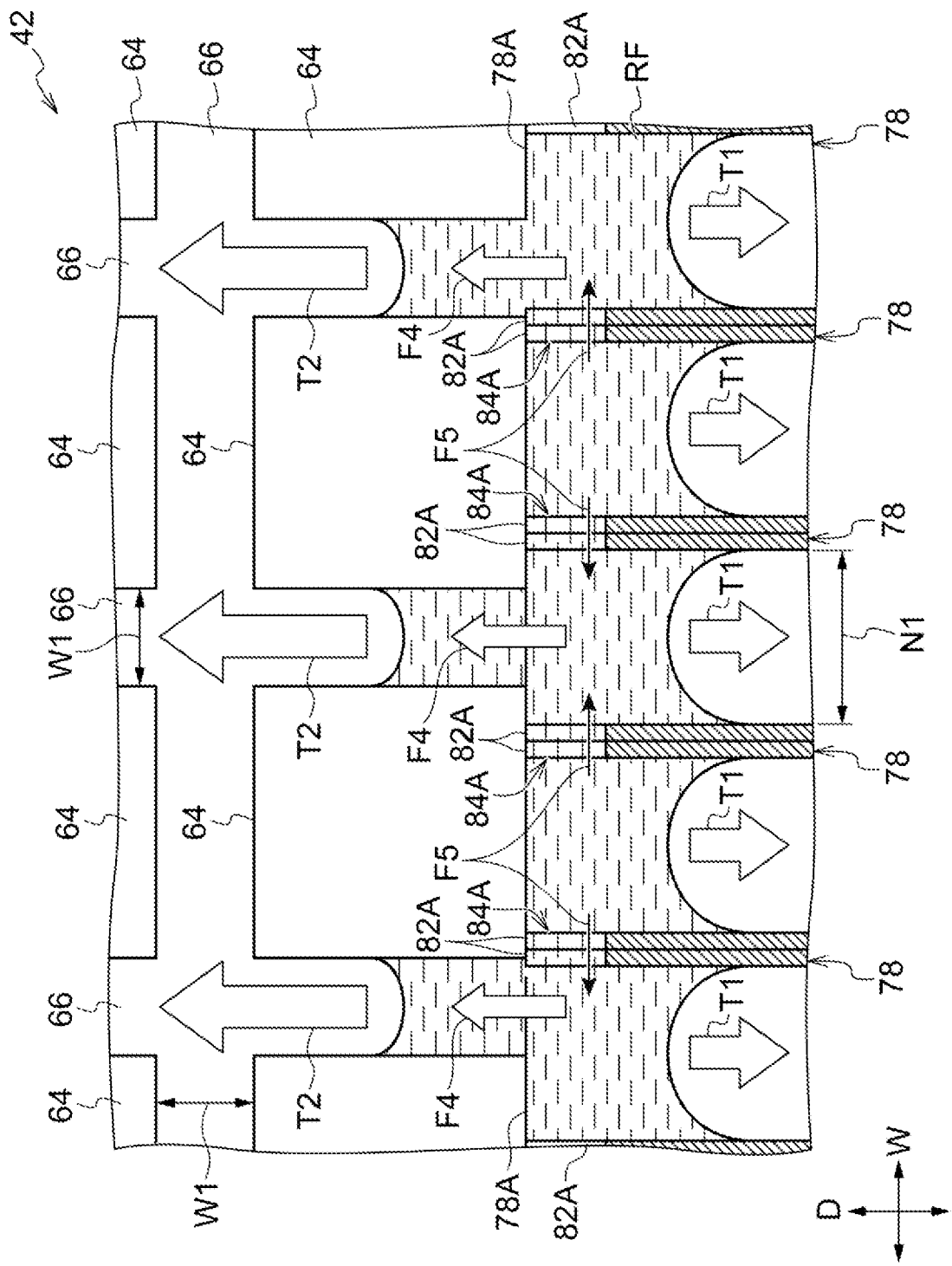
FIG. 7 is a plan view illustrating one end portions of transport pipes and part of an evaporator of a cooling device of the first exemplary embodiment.

As illustrated in FIG. 7, the internal diameter N1 of the transport pipes 78 is set to a diameter that enables the liquid-phase refrigerant RF to be transported by capillary action, while also enabling a sufficient amount of the refrigerant RF to be transported to the evaporator 62 by the plural transport pipes 78 in combination. The transport pipes 78 are an example of a transporter that transports the liquid-phase refrigerant RF to the evaporator 62 by capillary action.

An upper limit to the internal diameter N1 of each of the transport pipes 78 is determined such that the refrigerant RF is able to be transported from another end portion 78B to one end portion 78A by capillary action, even in cases in which the cooling device 42 is inclined such that the one end portion 78A is higher than the other end portion 78B.

Figure 13:
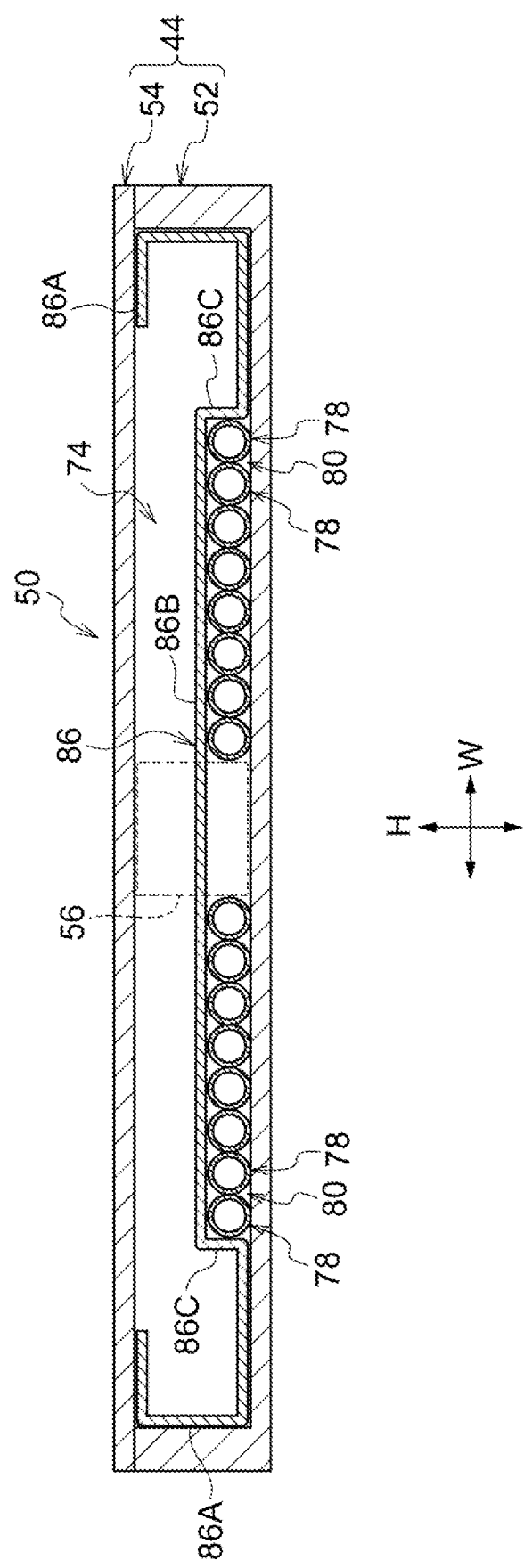
FIG. 13 is a cross-section sectioned along line 13-13 in FIG. 4, illustrating a cooling device of the first exemplary embodiment.

Note that in the present exemplary embodiment, as illustrated in FIG. 13, spaces 80 formed between the transport pipes 78 adjacently arranged in the width direction and the bottom plate 52 also configure a region capable of transporting the liquid-phase refrigerant RF by capillary action.

Figure 9:
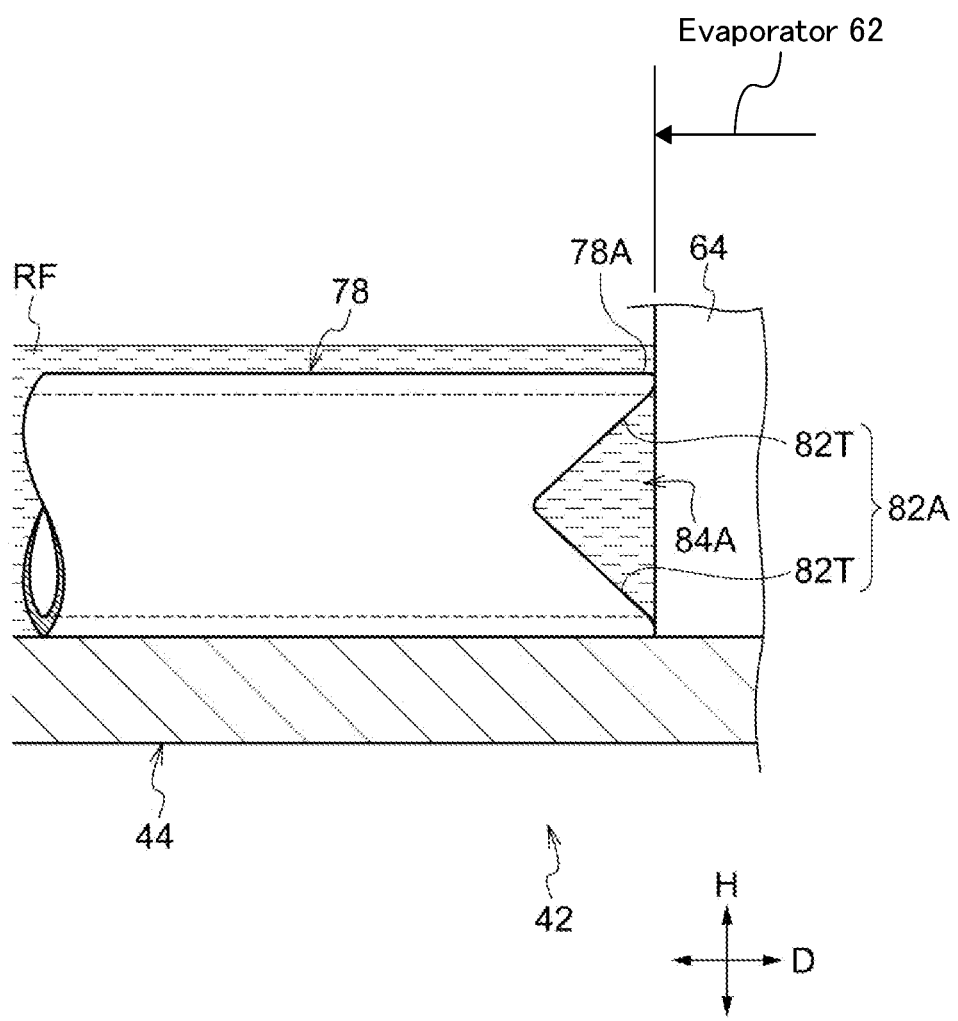
FIG. 9 is a side view illustrating one end portion of a transport pipe and part of an evaporator of a cooling device of the first exemplary embodiment.

As is also illustrated in FIG. 7 and FIG. 9, the one end portions 78A of the transport pipes 78 oppose the columnar members 64. In the first exemplary embodiment, the one end portions 78A are provided with gap generators. More specifically, the transport pipes 78 are notched at the one end portions 78A to form inclined portions 82A that are inclined with respect to the length direction of the transport pipes 78. The inclined portions 82A are an example of gap generators of the first exemplary embodiment.

In particular, in the present exemplary embodiment, as illustrated in FIG. 9, each of the inclined portions 82A is V-shaped, and includes inclined faces 82T formed in a pair so as to approach one another on progression away from the columnar members 64.

The locations where the inclined portions 82A are provided, namely a region between the inclined faces 82T, configure gaps 84A through which the liquid-phase refrigerant RF moves from the transport pipes 78 into the evaporator 62.

Plural of the inclined portions 82A are formed at uniform peripheral direction intervals around each individual transport pipe 78. In the present exemplary embodiment, as illustrated in FIG. 7, two of the inclined portions 82A are formed in each individual transport pipe 78 so as to be spaced apart from each other in the width direction of the vessel 44 (arrow W direction).

Figure 8:
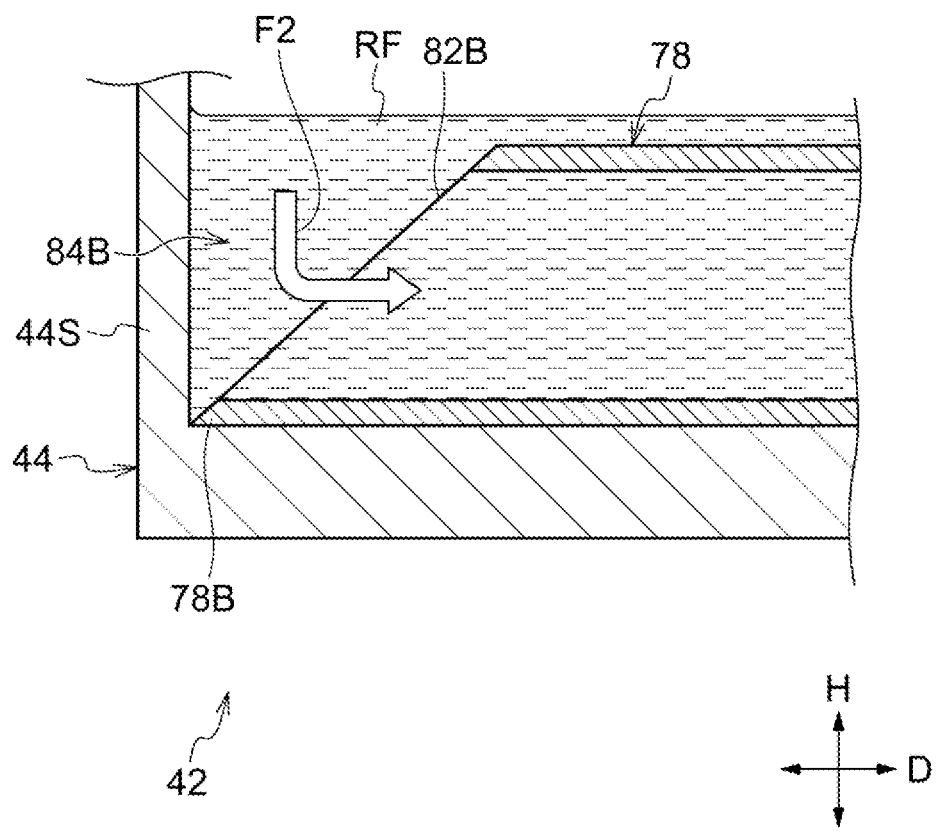
FIG. 8 is a cross-section illustrating another end portion of a transport pipe and part of a vessel of a cooling device of the first exemplary embodiment.

The other end portions 78B of the transport pipes 78 oppose a sidewall 44S of the vessel 44 as illustrated in FIG. 8. The sidewall 44S is a sidewall configuring a front side (condenser 72 side) end portion of the sidewall 44S in the depth direction.

The other end portions 78B of the transport pipes 78 are provided with second gap generators. Specifically, each of the other end portions 78B is formed with a second inclined portion 82B inclined in one direction with respect to the length direction of the transport pipes 78. A region between the sidewall 44S and the second inclined portions 82B configures second gaps 84B through which the liquid-phase refrigerant RF moves from the condenser 72 into the transport pipes 78.

As is also illustrated in FIG. 13, a fixing 86 (fixing plate) is disposed inside the vessel 44 at a location corresponding to the connection section 50. Each width direction (arrow W direction) side of the fixing 86 is provided with a fitting portion 86A that is fitted between the top plate 54 and the bottom plate 52, and the width direction center of the fixing 86 is provided with a pressing portion 86B that presses the plural transport pipes 78 toward the bottom plate 52. The transport pipes 78 are pressed against and thus fixed to the bottom plate 52 by the pressing portion 86B. Since the plural transport pipes 78 are in fixed contact with the bottom plate 52, a sufficient flow path cross-section area to allow the vapor-phase refrigerant RF to move effectively is secured between the top plate 54 and the transport pipes 78.

Since the respective sets of transport pipes 78 are positioned between the support columns 56 and a corresponding side face 86C of the pressing portion 86B, the transport pipes 78 are also retained with respect to the width direction.

As illustrated in FIG. 1 to FIG. 4, the bottom plate 52 of the vessel 44 is provided with fastening holes 88. Fasteners such as screws are inserted through the fastening holes 88 and fastened to the substrate 34, thereby fixing the cooling device 42 to the substrate 34. Since the element 36, this being a cooling target, is mounted to the substrate 34, the cooling device 42 is also fixed with respect to the element 36.

Note that the top plate 54 is shaped so as to avoid the fastening holes 88 as viewed along the overlapping direction of the top plate 54 and the bottom plate 52 (the arrow A1 direction in FIG. 1). The top plate 54 therefore does not become a hindrance when fixing the cooling device 42 to the substrate 34, thereby enabling a fastening operation of the fasteners (for example turning the screws) to be performed.

As illustrated in FIG. 1 and FIG. 2, fins 90 are attached to the top plate 54. The fins 90 increase the effective surface area of the vessel 44, namely the heat dissipation surface area over which heat is dissipated to the exterior (air cooling). In particular, in the present exemplary embodiment, the fins 90 are installed over substantially the entire top plate 54, thereby securing a large heat dissipation surface area.

Figure 17:
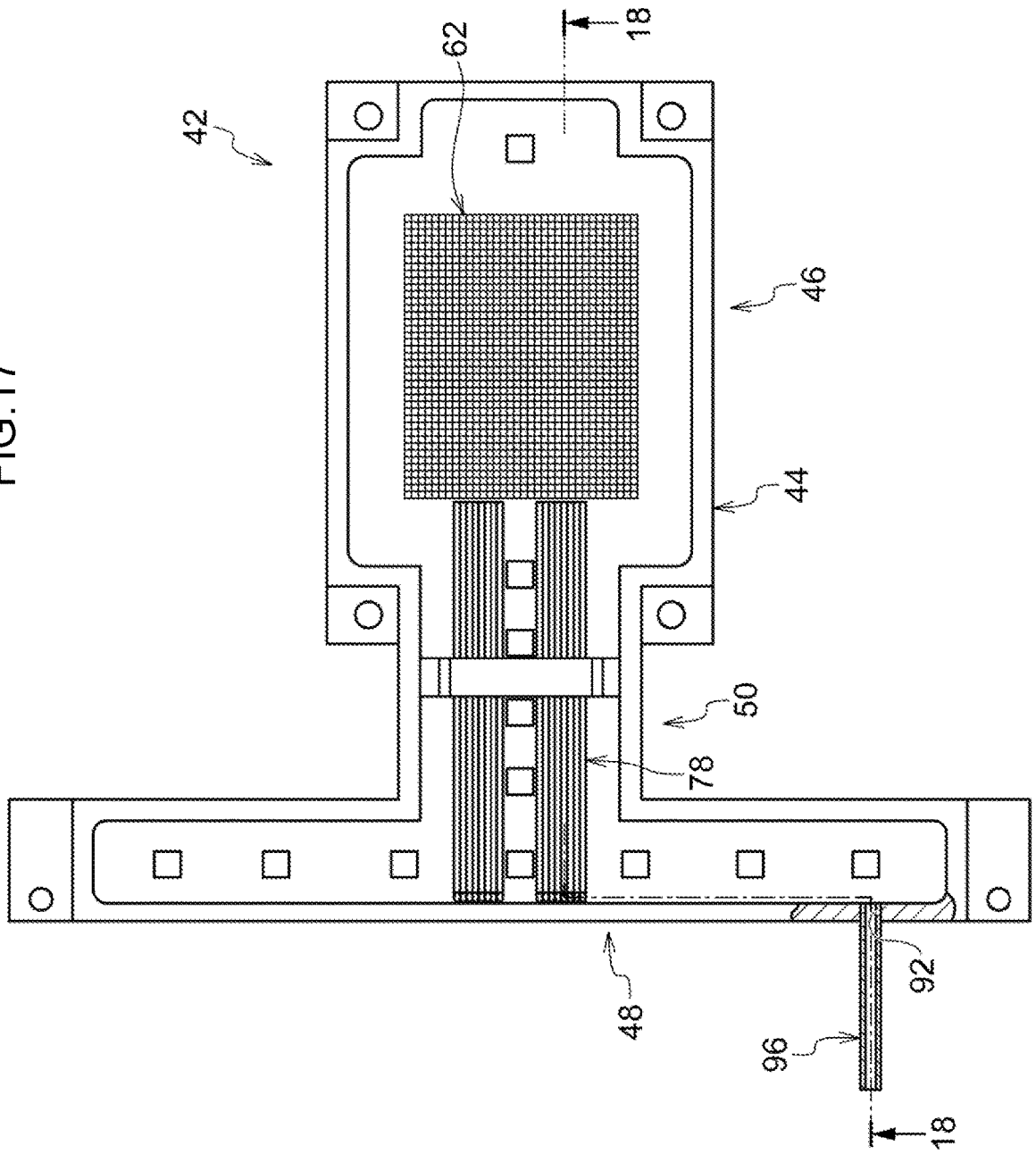
FIG. 17 is a plan view illustrating an internal structure of a cooling device of the present disclosure together with an injection hole and an injection pipe.
Figure 18:
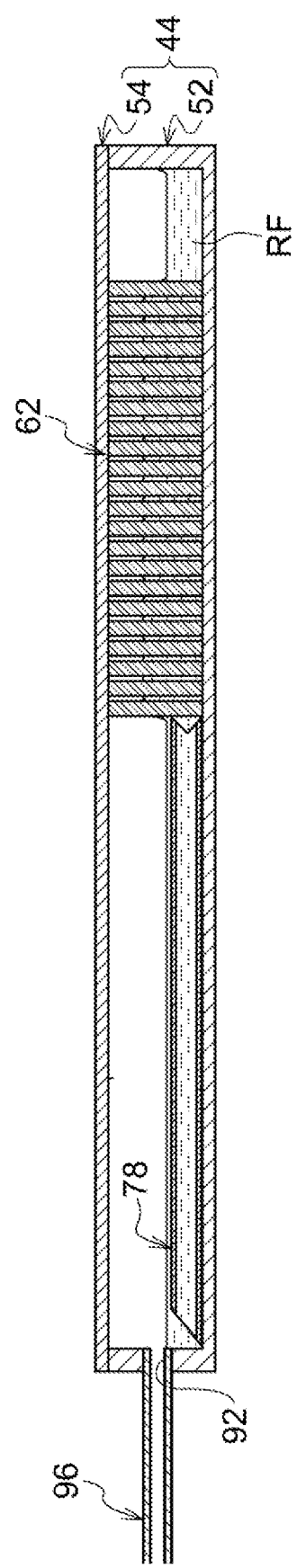
FIG. 18 is a cross-section sectioned along line 18-18 in FIG. 17, illustrating an internal structure of a cooling device of the present disclosure.
Figure 19:
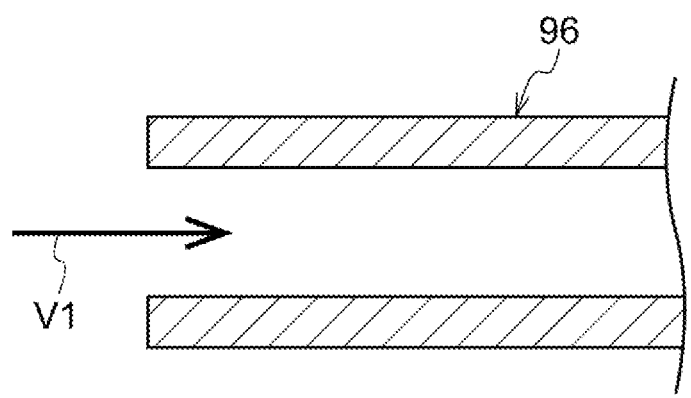
FIG. 19 is a cross-section illustrating an unclosed state of an injection pipe of a cooling device of the present disclosure.
Figure 20:
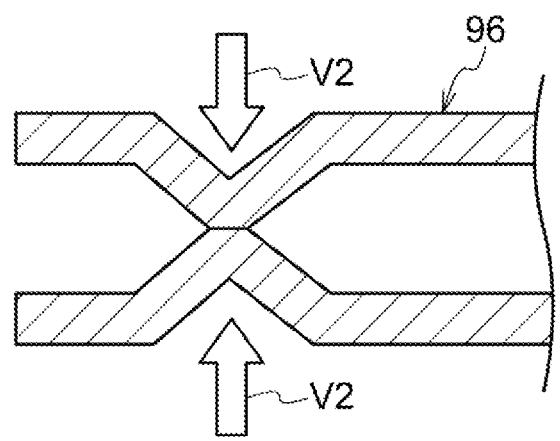
FIG. 20 is a cross-section illustrating a compressed and closed-off state of an injection pipe of a cooling device of the present disclosure.
Figure 21:
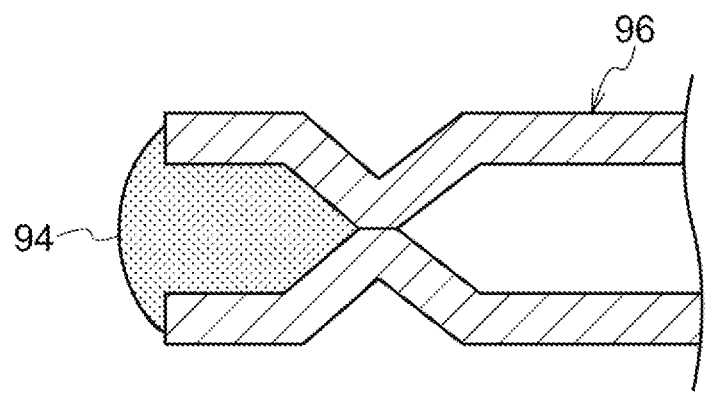
FIG. 21 is a cross-section illustrating a state in which an injection hole of a cooling device of the present disclosure has been plugged with a stopper at a leading end of an injection pipe.

As illustrated in FIG. 17 and FIG. 18, the vessel 44 is provided with an injection hole 92 that places the interior and exterior of the vessel 44 in communication with each other. An injection pipe 96 extends out from the injection hole 92 to the outside of the vessel 44. In order to inject the refrigerant RF into the vessel 44, a vacuum pump or the like is used to expel air from inside the vessel 44. Refrigerant is then injected through the injection pipe 96 as illustrated by the arrow V1 in FIG. 19. The refrigerant inside the vessel 44 is then heated until boiling, and dissolved air in the refrigerant RF is expelled to the exterior of the vessel 44. Note that in cases in which de-gassed refrigerant from which dissolved air has already been removed is employed, this operation is omitted. Next, the injection pipe 96 is compressed from the outside and closed off, as illustrated by the arrows V2 in FIG. 20. A leading end of the injection pipe 96 is then plugged using a stopper 94 as illustrated in FIG. 21 to plug the injection pipe 96 more firmly. Namely, providing the injection hole 92 enables the refrigerant RF to be injected into the vessel 44 through the injection hole 92. After injecting the refrigerant RF, the injection hole 92 is plugged using the stopper 94, thereby enabling the refrigerant RF to be sealed inside the vessel 44. Note that the injection hole 92, the stopper 94, and the injection pipe 96 are omitted from illustration with the exception of in FIG. 17 to FIG. 21.

Next, explanation follows regarding operation of the present exemplary embodiment.

As illustrated in FIG. 5, when the heat receiving section 46 receives heat from the element 36, this heat causes the liquid-phase refrigerant RF present in the grooved section 66 of the evaporator 62 to vaporize. Namely, the liquid-phase refrigerant RF transitions to the vapor phase as a result of evaporation from the surface of the refrigerant RF (see the arrows GF), and boiling from within the refrigerant RF (see the gas bubbles GB).

The vapor-phase refrigerant RF disperses in the dispersion region 68, and moves through the movement region 74 into the heat dissipating section 48 (see arrow F1 in FIG. 6). In the dispersion region 68 and the movement region 74, some of the vapor-phase refrigerant RF condenses and liquefies as a result of heat dissipation through the fins 90. Refrigerant RF that reaches the heat dissipating section 48 while still in the vapor phase state then condenses and liquefies as a result of cooling by the fins 90 of the heat dissipating section 48. Due to liquefying the vapor-phase refrigerant RF in this manner, the heat of condensation is released to the exterior of the vessel 44 through the top plate 54. The heat of the element 36 is thus expelled into the external air as a result.

As illustrated in FIG. 4, the condenser 72 is formed broader than the evaporator 62 in the width direction (arrow W direction). This enables a larger surface area to be secured for heat dissipation from the vapor-phase refrigerant RF, and thus enables condensation of the refrigerant RF to be promoted, in comparison to structures in which the condenser 72 is not broader.

Liquid-phase refrigerant RF inside the vessel 44 enters the transport pipes 78 through the other end portions 78B of the transport pipes 78 as illustrated by the arrow F2 in FIG. 8. This refrigerant RF is then transported to the one end portions 78A, namely toward the evaporator 62, by capillary action as illustrated by the arrows F3 in FIG. 5 and FIG. 6. The liquid-phase refrigerant RF is also transported to the evaporator 62 by capillary action in the spaces 80 (see FIG. 13) between the transport pipes 78 and the bottom plate 52.

In the evaporator 62, the liquid-phase refrigerant RF once again evaporates and vaporizes in the grooved section 66. This phase transition of the refrigerant RF between the liquid phase and the vapor phase is repeated inside the vessel 44 as the refrigerant RF circulates between the evaporator 62 and the condenser 72. Heat received by the heat receiving section 46 can thus be carried to the heat dissipating section 48. This enables the element 36 serving as the cooling target to be cooled.

As illustrated in FIG. 7, in the present exemplary embodiment, the groove width W1 of the grooved section 66 of the evaporator 62 is smaller than the internal diameter N1 of the transport pipes 78.

Figure 10:
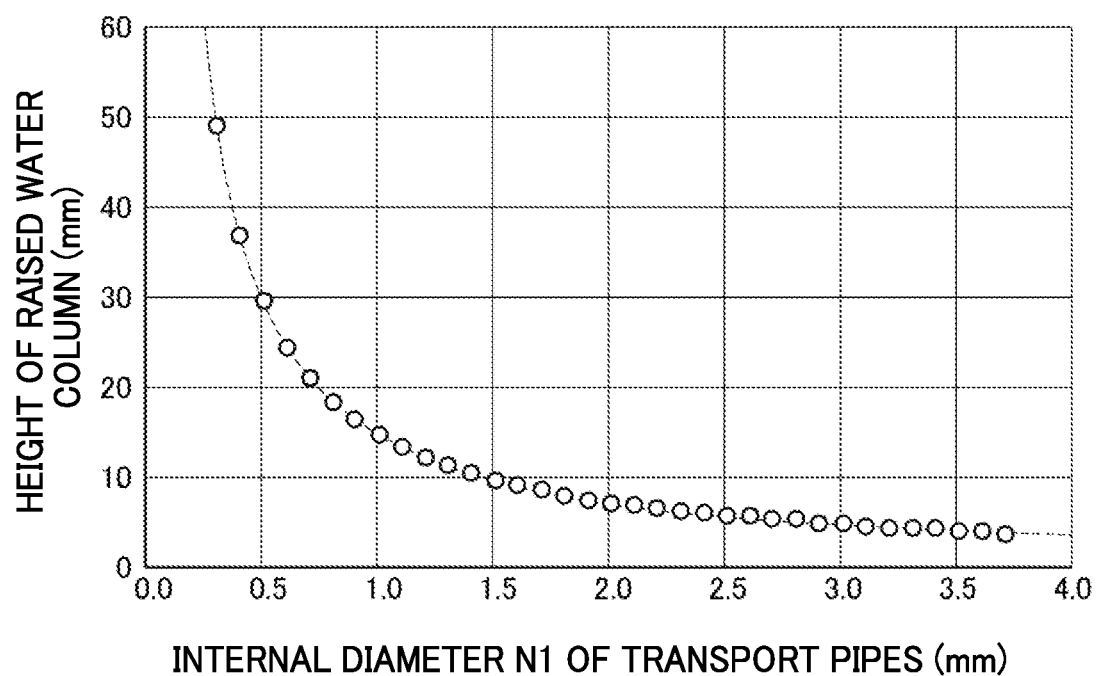
FIG. 10 is a graph illustrating a relationship between the internal diameter of a transport pipe and the height of a raised water column inside the transport pipe.

FIG. 10 illustrates a relationship between the internal diameter N1 of the transport pipes 78 and a raised height of the rising liquid column due to surface tension (capillary action) inside the transport pipes 78 at a liquid temperature of 25° C. This graph illustrates an example in which water is employed as the refrigerant RF, as in the present exemplary embodiment.

As can be seen from this graph, as the internal diameter N1 of the transport pipes 78 gets smaller, the height of the liquid column is raised further. Namely, reducing the internal diameter N1 enables the refrigerant RF to be raised more by surface tension.

The liquid-phase refrigerant RF is transported to the evaporator 62 through the transport pipes 78 as illustrated by the arrows F3 in FIG. 5 and FIG. 6. However, surface tension of the liquid-phase refrigerant RF inside the one end portions 78A of the transport pipes 78 may cause a refrigerant suction force T1 to act in a direction away from the evaporator 62, as illustrated in FIG. 7. A contrasting refrigerant suction force T2 may also act to draw the refrigerant RF inside the evaporator 62 due to surface tension of the liquid-phase refrigerant RF in the grooved section 66 of the evaporator 62. Although the refrigerant suction force T1 and the refrigerant suction force T2 are forces acting in opposite directions to each other, since the refrigerant suction force T2 is the greater of these forces, the refrigerant RF flows from the transport pipes 78 toward the evaporator 62 as illustrated by the arrows F4.

Note that as illustrated in FIG. 6, for example, the cooling device 42 may conceivably be used when inclined such that the one end portions 78A are higher than the other end portions 78B. Consider as an example a case in which the one end portions 78A are around 25 mm higher than the other end portions 78B. In this case, it can be seen that if the internal diameter N1 of the transport pipes 78 is set to 0.6 mm or less, surface tension enables the refrigerant RF to be transported inside the transport pipes 78 from the other end portions 78B toward the one end portions 78A.

From the perspective of increasing the surface tension that acts on the refrigerant RF inside the transport pipes 78 in this manner, the internal diameter N1 of the transport pipes 78 may be set smaller. However, decreasing the size of the internal diameter N1 of the transport pipes 78 also reduces the flow path cross-section area for the refrigerant RF, reducing the amount of the refrigerant RF that can being transported per unit time. A lower limit of the internal diameter N1 of the transport pipes 78 is thus determined from the perspective of securing the transport rate of the refrigerant RF per unit time.

As illustrated in FIG. 7, in the present exemplary embodiment, the groove width W1 of the grooved section 66 is narrower than the internal diameter N1 of the transport pipes 78. According to the relationship illustrated in FIG. 10, the surface tension acting on the liquid-phase refrigerant RF in the evaporator 62 is greater than the surface tension acting on the liquid-phase refrigerant RF in the transport pipes 78. Accordingly, the difference between the refrigerant suction force T1 and the refrigerant suction force T2 causes a force to act that attempts to move the refrigerant RF from the transport pipes 78 toward the evaporator 62, thus enabling the refrigerant RF to be moved from the transport pipes 78 into the evaporator 62.

Consider a case in which the one end portions 78A of the transport pipes 78 are formed with a flat profile structure without the gap generators being provided. In transport pipes having flat one end portions 78A, were opening portions in the transport pipes to contact the opposing columnar members 64 around the entire periphery of the transport pipes, these opening portions would be covered off by the columnar members 64. Although it would be possible to secure a range where such opening portions of the transport pipes are not covered by the columnar members 64 if the internal diameter N1 of the transport pipes were increased, there is an upper limit to the internal diameter N1 in order to cause surface tension to reliably act on the refrigerant RF as described above.

By contrast, in the present exemplary embodiment, the inclined portions 82A are provided to the one end portions 78A of the transport pipes 78 as an example of gap generators. Even were the leading end portions of the one end portions 78A to contact the evaporator 62, the gaps 84A where there is no contact with the evaporator 62 are present between the transport pipes 78 and the evaporator 62. Namely, a structure is configured in which the opening portions of the one end portions 78A of the transport pipes 78 are not completely blocked off by the columnar members 64. Accordingly, as illustrated by the arrows F5 in FIG. 7, the liquid-phase refrigerant RF transported by the transport pipes 78 flows into the grooved section 66 of the evaporator 62 through the gaps 84A. Namely, a structure is achieved that facilitates the movement of the liquid-phase refrigerant RF from the transport pipes 78 into the evaporator 62.

As described above, in a structure in which the groove width W1 of the grooved section 66 is narrower than the internal diameter N1 of the transport pipes 78, the columnar members 64 become comparatively thick and thus cover opening portions in the transport pipes 78 over a wider range. However, even in such a structure, since the gaps 84A are present between the transport pipes 78 and the evaporator 62 in the present exemplary embodiment, the liquid-phase refrigerant RF can be reliably moved from the transport pipes 78 to the evaporator 62.

In the first exemplary embodiment, the gap generators are configured by the inclined portions 82A provided to the one end portions 78A of the transport pipes 78. Providing the gap generators to the transport pipes 78 in this manner renders other members to generate the gaps 84A unnecessary, enabling the structure of the cooling device 42 to be simplified.

The gap generators are configured by the inclined portions 82A in the example described above. Namely, the gaps 84A can be generated by the simple structure of inclining the one end portions 78A of the transport pipes 78 with respect to the length direction of the transport pipes 78.

As illustrated in FIG. 9, each of the inclined portions 82A is provided with the pair of inclined faces 82T. The inclined faces 82T are faces that approach each other on progression away from the evaporator 62. Forming the inclined portions 82A with the inclined faces 82T in this manner enables a structure to be attained in which the gaps 84A are generated without the inclined portions 82A having an excessive notch depth (length of a portion notched from the evaporator 62 side).

Note that the one end portions 78A of the transport pipes 78 may be provided with inclined portions inclined in one direction, similarly to the second inclined portions 82B of the other end portions 78B.

The inclined portions 82A serving as an example of gap generators are provided at plural locations (two locations in the present exemplary embodiment) around the peripheral direction of each individual transport pipe 78. Providing plural gap generators in this manner generates plural of the gaps 84A, enabling a greater cross-section area to be secured for a location through which the refrigerant RF flows from the transport pipes 78 to the evaporator 62 in comparison to structures in which a gap generator is only provided at a single location on each individual transport pipe 78.

The other end portions 78B of the transport pipes 78 are provided with the second inclined portions 82B serving as an example of second gap generators, and the second gaps 84B are generated between the other end portions 78B and the sidewall 44S of the vessel 44. Namely, a structure is configured in which opening portions of the other end portions 78B of the transport pipes 78 are not blocked off by the sidewall 44S. This enables a structure to be attained that facilitates the flow of the liquid-phase refrigerant RF inside the vessel 44 into the transport pipes 78 through the second gaps 84B.

Plural of the transport pipes 78 serving as an example of a transporter are provided. As described above, since there is an upper limit to the internal diameter N1 of the transport pipes 78 from the perspective of increasing surface tension acting on the liquid-phase refrigerant RF flowing through the transport pipes 78, it would be difficult to secure a sufficient flow rate using just a single transport pipe 78. To address this, providing plural of the transport pipes 78 enables a greater flow rate to be secured through the transport pipes 78 as a whole.

Plural of the transport pipes 78 are disposed such that flow paths for the liquid-phase refrigerant RF are also formed between two adjacent transport pipes 78 and the bottom plate 52. Since not only the interior of the transport pipes 78 but also the exterior of the transport pipes 78 are utilized as regions through which the liquid-phase refrigerant RF flows, a greater flow rate of the refrigerant RF can be secured than in structures in which flow paths are not formed in this manner.

The support columns 56 are disposed between the top plate 54 and the bottom plate 52 in the vessel 44 interior. The separation between the top plate 54 and the bottom plate 52 can be maintained by the support columns 56, enabling the volume of the interior of the vessel 44 through which the refrigerant RF circulates while transitioning between the liquid phase and the vapor phase to be secured. In particular, the interior of the vessel 44 is maintained at a lower pressure than atmospheric pressure in order to promote vaporization of the liquid-phase refrigerant RF. A force pulling the top plate 54 and the bottom plate 52 in directions toward each other therefore acts due to the pressure difference between the pressure of the interior of the vessel 44 (the vapor pressure of the vapor-phase refrigerant RF) and atmospheric pressure. The separation between the top plate 54 and the bottom plate 52 can be maintained despite the action of this force.

A structure may be also adopted in which the support columns 56 are provided to the top plate 54 and their lower ends contact the bottom plate 52, or a structure may be adopted in which the support columns 56 are provided as separate bodies to both the top plate 54 and the bottom plate 52, such that their upper ends contact the top plate 54 and their lower ends contact the bottom plate 52.

The transport pipes 78 are fixed to the vessel 44 by the fixing 86. Since the transport pipes 78 are not fixed to the vessel by brazing or adhesion, there is no need for brazing or adhesive. Since there are no issues regarding brazing or adhesive melting as a result of temperature changes (rising temperature) or the like during use of the cooling device 42, there is no effect on the phase transitions of the refrigerant RF inside the vessel 44.

The fixing 86 fixes the plural transport pipes 78 in contact with the bottom plate 52, thereby enabling a sufficient flow path cross-section area to be secured for the vapor-phase refrigerant RF to move effectively between the top plate 54 and the transport pipes 78.

The top plate 54 is provided with the projections 76. The vapor-phase refrigerant RF that flows while in contact with the top plate 54 condenses and liquefies due to dissipating heat to the vessel 44 exterior through the top plate 54. When this occurs, as illustrated in FIG. 12, the projections 76 increase the effective contact surface area over which the refrigerant RF contacts the top plate 54 in comparison to structures in which the projections 76 are not present. This facilitates the liquefaction of the vapor-phase refrigerant RF into liquid droplets RD, thus enabling liquefaction of the refrigerant RF to be promoted. The liquefied refrigerant RF is conveyed to and drips down the projections 76, thereby enabling the liquid film at locations of the top plate 54 not formed with the projections 76 to be maintained in a thin state. Maintaining the liquid film in a thin state enables efficient movement of heat from the vapor-phase refrigerant RF into the top plate 54, thus enabling a structure to be attained that maintains high condensation and liquefaction performance of the refrigerant RF.

The vessel 44 is provided with the fastening holes 88. A structure in which the cooling device 42 is fixed to the substrate 34 and also fixed to the element 36 that is the cooling target can thus be easily obtained by inserting the fasteners through the fastening holes 88.

The cooling device 42 includes the fins 90. The fins 90 increase the surface area over which the cooling device 42 dissipates heat to its exterior, thereby enabling more efficient condensation and liquefaction of the vapor-phase refrigerant RF inside the vessel 44 than in a structure in which the fins 90 are not present.

The vessel 44 includes the injection hole 92. The refrigerant RF can be easily injected inside the vessel 44 through the injection pipe 96 using this injection hole 92. The injection hole 92 is then plugged with the stopper 94 by stopping the injection pipe 96 with the stopper 94, enabling a structure in which the refrigerant RF is sealed inside the vessel 44 to be attained.

Next, explanation follows regarding a second exemplary embodiment. In the second exemplary embodiment, elements, members, and so on that are similar to those of the first exemplary embodiment are allocated the same reference numerals, and detailed explanation thereof is omitted. Moreover, since the overall structure of a cooling device 202 of the second exemplary embodiment is similar to that of the cooling device 42 of the first exemplary embodiment, illustration thereof is omitted.

Figure 14:
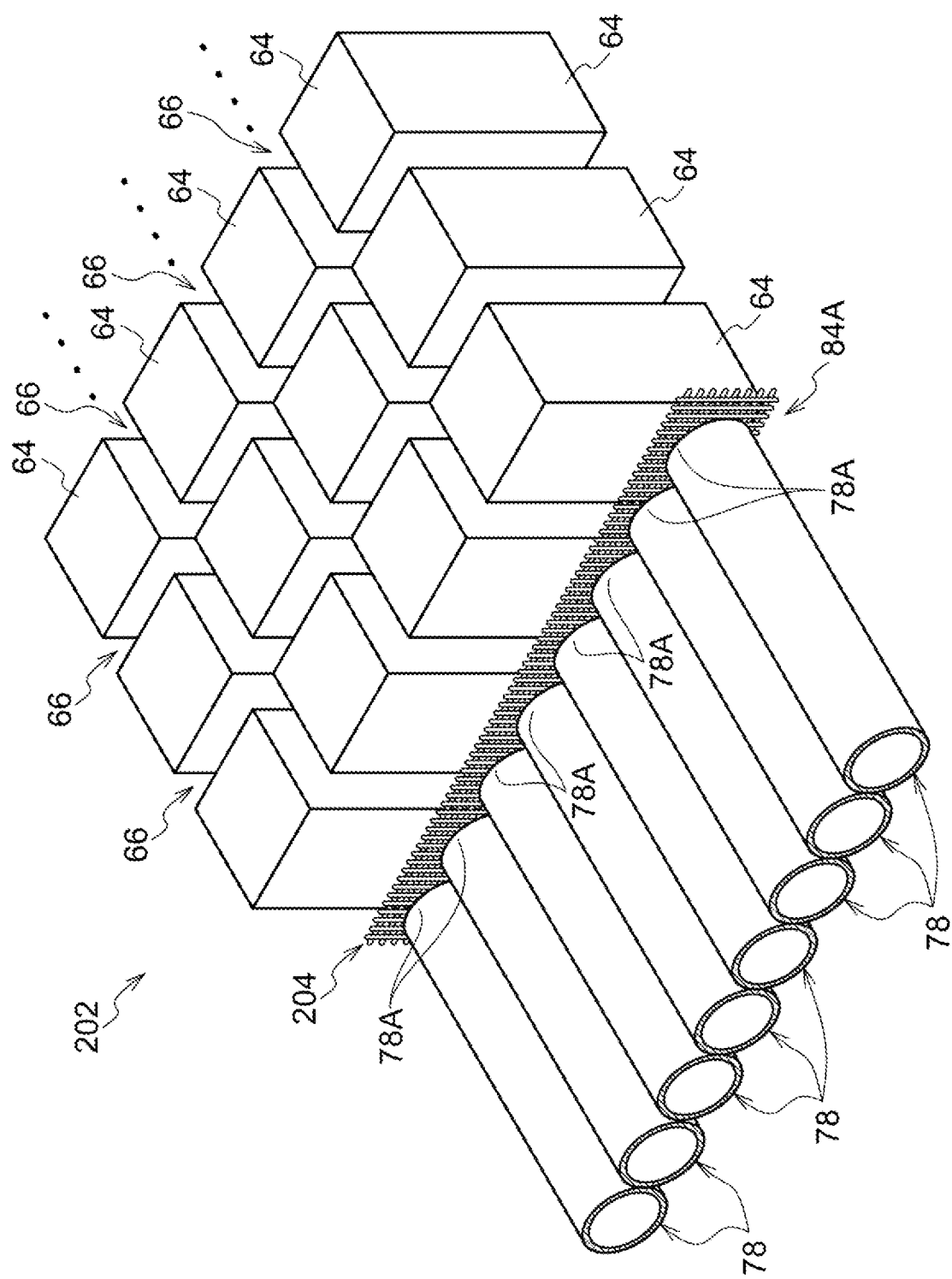
FIG. 14 is an enlarged perspective view illustrating a mesh member and the vicinity thereof in a cooling device of a second exemplary embodiment.

As illustrated in FIG. 14, the cooling device 202 of the second exemplary embodiment includes a mesh member 204 that is a separate body to the transport pipes 78 and the evaporator 62 and serves as an example of a gap generator. The mesh member 204 is disposed between the transport pipes 78 and the evaporator 62. One face of the mesh member 204 contacts the transport pipes 78, and the other face of the mesh member 204 contacts the evaporator 62. Note that in the cooling device 42 of the second exemplary embodiment, the one end portions 78A of the transport pipes 78 are not formed with the inclined portions 82A (see FIG. 9) of the first exemplary embodiment, such that the one end portions 78A are orthogonal to the length direction of the transport pipes 78.

The mesh member 204 is a member that allows the movement of fluid in its thickness direction (arrow T direction), and the mesh member 204 generates a gap 84A between the transport pipes 78 and the evaporator 62. The one end portions 78A of the transport pipes 78 are therefore not blocked off by the evaporator 62, thus securing a flow path of the refrigerant RF from the one end portions 78A toward the evaporator 62. Namely, the cooling device 202 of the second exemplary embodiment also attains a structure that facilitates movement of the liquid-phase refrigerant RF from the transport pipes 78 to the evaporator 62.

In the second exemplary embodiment, the mesh member 204 serving as an example of a gap generator is a separate body to the transport pipes 78 and the evaporator 62. The shapes of the transport pipes 78 and the evaporator 62 are therefore not affected. For example, the structure can be simplified since the one end portions 78A of the transport pipes 78 do not need to be processed.

The mesh member 204 is disposed between the transport pipes 78 and the evaporator 62, and is in contact with both. The relative positions of the transport pipes 78 and the evaporator 62 are thus maintained, enabling a state in which the gap 84A is generated to be maintained.

Next, explanation follows regarding a third exemplary embodiment. In the third exemplary embodiment, elements and members similar to those of the first exemplary embodiment are allocated the same reference numerals, and detailed explanation thereof is omitted. Moreover, since the overall structure of a cooling device 302 of the third exemplary embodiment is similar to that of the cooling device 42 of the first exemplary embodiment, illustration thereof is omitted.

Figure 15:
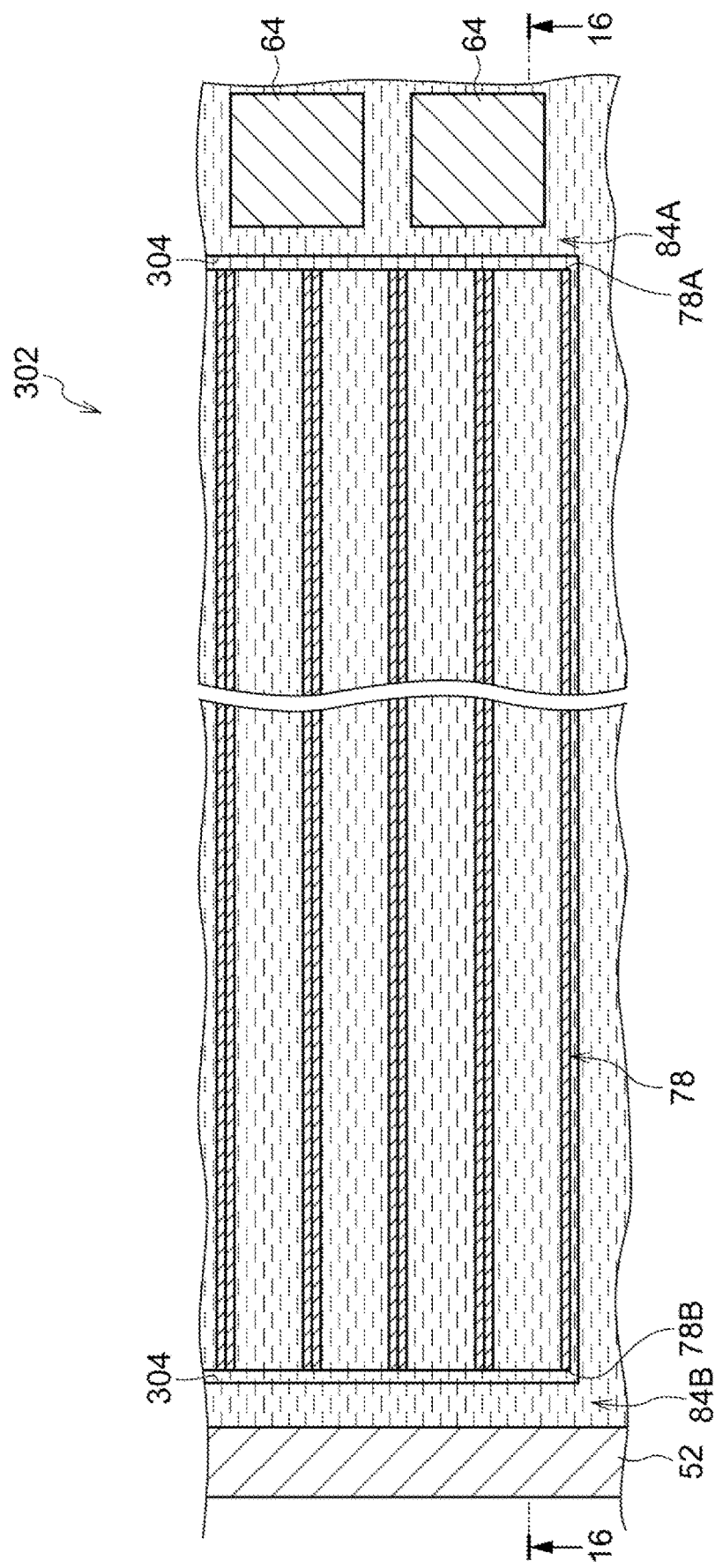
FIG. 15 is a plan view cross-section partially illustrating a cooling device of a third exemplary embodiment.
Figure 16:
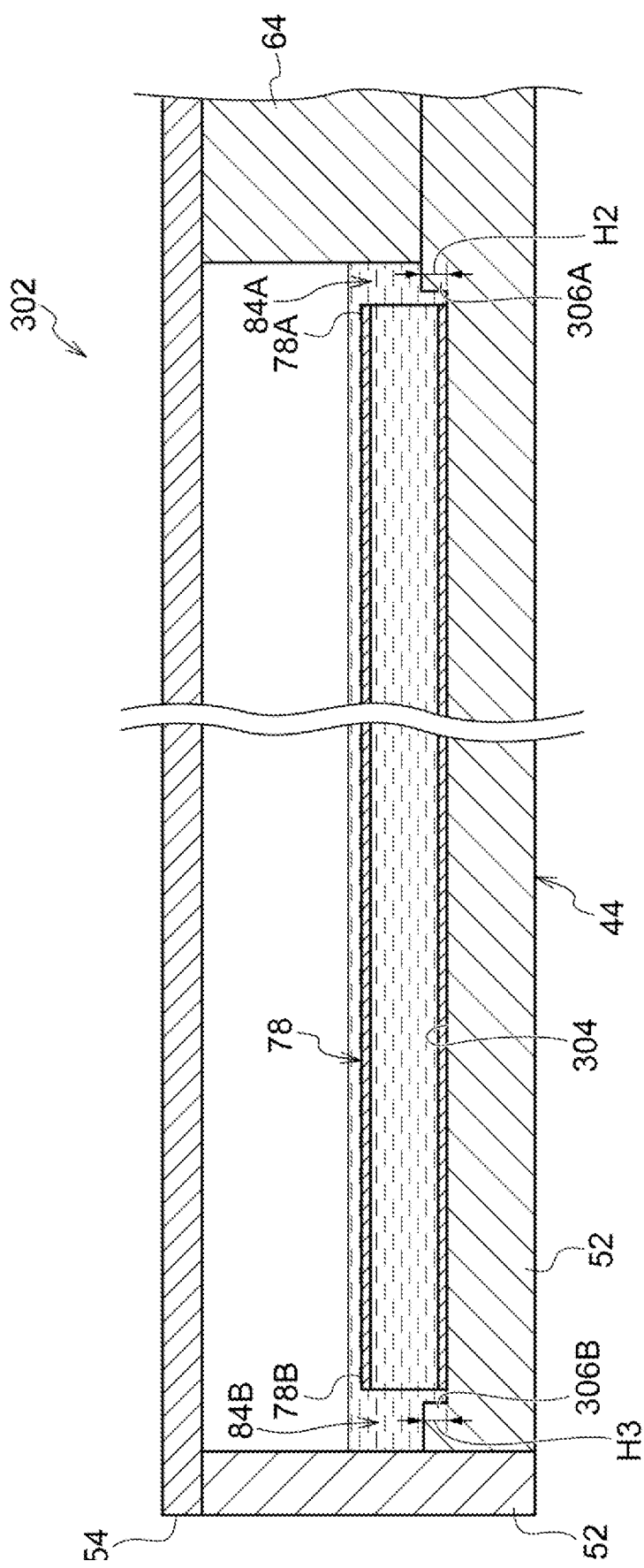
FIG. 16 is a cross-section sectioned along line 16-16 in FIG. 15, illustrating a cooling device of the third exemplary embodiment.

As illustrated in FIG. 15 and FIG. 16, in the cooling device 302 of the third exemplary embodiment, the bottom plate 52 is provided with a recess portion 304. The recess portion 304 has a shape capable of housing lower portions of the respective transport pipes 78. A wall 306A configuring part of the bottom plate 52 is provided between the recess portion 304 and the evaporator 62. A second wall 306B configuring part of the bottom plate 52 is provided between the recess portion 304 and the sidewall 44S of the vessel 44. The wall 306A and the second wall 306B are in effect locations where the recess portion 304 is not provided to the bottom plate 52.

The wall 306A opposes the one end portions 78A of the transport pipes 78, and is set with a height H2 that does not in effect interfere with the flow of the refrigerant RF at inner peripheral locations of the transport pipes 78. The wall 306A generates a gap 84A between the one end portions 78A of the transport pipes 78 and the condenser 72. Namely, in the third exemplary embodiment, the wall 306A serves as an example of a gap generator.

In this manner, in the third exemplary embodiment, the wall 306A generates the gap 84A between the transport pipes 78 and the evaporator 62. The one end portions 78A of the transport pipes 78 are therefore not blocked by the evaporator 62, thus securing a flow path of the refrigerant RF from the one end portions 78A toward the evaporator 62. Namely, the cooling device 302 of the third exemplary embodiment also attains a structure that facilitates movement of the liquid-phase refrigerant RF from the transport pipes 78 to the evaporator 62.

The second wall 306B opposes the other end portions 78B of the transport pipes 78, and is set with a height H3 that does not in effect interfere with the flow of the refrigerant RF at inner peripheral locations of the transport pipes 78. The second wall 306B generates a second gap 84B between the other end portions 78B of the transport pipes 78 and the sidewall 44S of the vessel 44. Namely, in the third exemplary embodiment, the second wall 306B serves as an example of a second gap generator. Note that since the height H2 of the wall 306A and the height H3 of the second wall 306B both correspond to the depth of the recess portion 304, the height H2 of the wall 306A and the height H3 of the second wall 306B are equal to each other.

In the third exemplary embodiment, the wall 306A serving as an example of a gap generator is provided to the vessel 44. Since gap generators are not provided to the transport pipes 78, the structure can be simplified since the one end portions 78A of the transport pipes 78 do not need to be processed. Moreover, since there is no need to provide an additional member as the gap generator, there is no increase to the number of components.

In the third exemplary embodiment, the vessel 44 is provided with the recess portion 304. This enables a structure including a gap generator to be attained by a simple structure at a location opposing the one end portions 78A of the transport pipes 78.

Since the transport pipes 78 are housed in the recess portion 304 of the bottom plate 52, a larger space between the transport pipes 78 and the top plate 54, namely a larger region serving as a movement portion can be secured compared to structures in which the recess portion 304 is not provided.

In the foregoing explanation, the columnar members 64 are an example of members used to form the grooved section 66 in the evaporator 62. However, members used to form the grooved section 66 are not limited to columnar members. For example, a structure may be adopted in which plural wall members extending in the depth direction are arranged at uniform intervals in the width direction. In a structure provided with such wall members, grooved sections extending in the depth direction are formed between the wall members.

Although explanation has been given regarding exemplary embodiments of technology disclosed herein, the technology disclosed herein is not limited to the above. Obviously various modifications may be implemented within a range not departing from the spirit of the technology disclosed herein.

Related technology exists having a structure in which liquid-phase refrigerant sealed inside a vessel is transported to an evaporator by a tube shaped transporter and an internal diameter of a tube of the transporter is appropriately set to enable the refrigerant to be transported by capillary action.

However, simply joining the transporter and the evaporator together may cause an exit portion of the liquid-phase refrigerant in the transporter to be covered by the evaporator, hindering movement of the liquid-phase refrigerant into the evaporator.

By contrast, the technology disclosed herein is capable of facilitating the movement of liquid-phase refrigerant from a transporter to an evaporator in a cooling device that moves heat using refrigerant phase changes between a vapor phase and a liquid phase inside a vessel.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

All cited documents, patent applications and technical standards mentioned in the present specification are incorporated by reference in the present specification to the same extent as if the individual cited documents, patent applications and technical standards were specifically and individually incorporated by reference in the present specification.

What is claimed is:

1. A cooling device, comprising:
   a vessel having a refrigerant sealed inside and formed with a top plate and a bottom plate;
   an evaporator inside the vessel, the evaporator provided with a plurality of columnar members extending from the bottom plate to contact the top plate, to receive heat to evaporate a liquid phase of the refrigerant as a liquid-phase refrigerant in a groove between the plurality of columnar members;
   a condenser that dissipates heat to condense a vapor phase of the refrigerant inside the vessel;
   a plurality of tube-shaped transporters arranged adjacent to each other in a width direction of the vessel, with a fixing plate configured to fix the plurality of tube-shaped transporters to the vessel, so that the plurality of tube-shaped transporters is to transport the liquid-phase refrigerant inside the vessel to the evaporator by capillary action; and
   a gap generator that forms a gap between end portions in a length direction of the plurality of tube-shaped transporters,
   wherein the plurality of tube-shaped transporters oppose the plurality of columnar members of the evaporator, so that the liquid-phase refrigerant is to move from the plurality of tube-shaped transporters to the evaporator,
   wherein the gap and the end portions of the plurality of tube-shaped transporters are not occluded by the evaporator.

2. The cooling device of claim 1, wherein,
   the groove has a narrower groove width than an internal diameter of a tube-shaped transporter of the plurality of tube-shaped transporters.

3. The cooling device of claim 2, wherein an other end portion of each tube-shaped transporter of the plurality of tube-shaped transporters forms an other gap with a sidewall of the vessel opposing each end portion of the end portions of the plurality of tube-shaped transporters.

4. The cooling device of claim 3, wherein:
   the vessel is provided with a recess portion that houses the plurality of tube-shaped transporters; and
   the other gap is provided in the recess portion at the sidewall.

5. The cooling device of claim 1, wherein the gap generator is a separate body from the plurality of tube-shaped transporters and from the evaporator.

6. The cooling device of claim 5, wherein the gap generator is a mesh member disposed between the plurality of tube-shaped transporters and the evaporator.

7. The cooling device of claim 6, wherein the mesh member contacts both the plurality of tube-shaped transporters and the evaporator.

8. The cooling device of claim 1, wherein each end portion of the end portions of the plurality of tube-shaped transporters, includes an inclined portion that includes a pair of inclined faces that incrementally approach each other on progression away from the evaporator.

9. The cooling device of claim 8, wherein the inclined portion includes a plurality of inclined portions provided at a plurality of locations along a peripheral direction of each tube-shaped transporter of the plurality of tube-shaped transporters.

10. The cooling device of claim 1, further comprising a second gap generator to form an other gap between each tube-shaped transporter of the plurality of tube-shaped transporters and a sidewall of the vessel for the liquid-phase refrigerant to flow into each tube-shaped transporter of the plurality of tube-shaped transporters from the condenser, so that the other gap separates an other end portion of each tube-shaped transporter of the plurality of tube-shaped transporters at a side of the condenser from the sidewall while the other end portion of each tube-shaped transporter of the plurality of tube-shaped transporters is not occluded by the condenser.

11. The cooling device of claim 1, wherein the plurality of tube-shaped transporters are disposed so as to form a flow path along which the liquid-phase refrigerant flows between the plurality of tube-shaped transporters and the bottom plate of the vessel.

12. The cooling device of claim 1, further comprising a support column disposed between the top plate and the bottom plate of the vessel so as to maintain a separation between the top plate and the bottom plate.

13. The cooling device of claim 1, wherein the condenser includes a projection that projects into the vessel from the top plate of the vessel.

14. The cooling device of claim 1, further comprising a fastening hole provided in the vessel such that a fastener used to fix the vessel to a cooling target is insertable through the fastening hole.

15. The cooling device of claim 1, further comprising a fin that is in contact with the vessel and that releases heat of the vessel to an exterior of the vessel.

16. The cooling device of claim 1, further comprising:
an injection hole provided in the vessel and configured such that the refrigerant is injected into the vessel through the injection hole; and
a stopper configured to plug the injection hole.

17. A cooling device comprising:
a vessel having a refrigerant sealed inside and formed with a top plate and a bottom plate;
an evaporator inside the vessel, the evaporator provided with a plurality of columnar members extending from the bottom plate to contact the top plate, to receive heat to evaporate a liquid phase of the refrigerant as a liquid-phase refrigerant in a groove between the plurality of columnar members;
a condenser that dissipates heat to condense a vapor phase of the refrigerant inside the vessel;
a plurality of tube-shaped transporters arranged adjacent to each other in a width direction of the vessel, with a fixing plate configured to fix the plurality of tube-shaped transporters to the vessel, so that the plurality of tube-shaped transporters is to transport the liquid-phase refrigerant inside the vessel to the evaporator by capillary action; and
a gap generator that forms a gap between end portions in a length direction of the plurality of tube-shaped transporters,
wherein the plurality of tube-shaped transporters oppose the plurality of columnar members of the evaporator, so that the liquid-phase refrigerant is to move from the plurality of tube-shaped transporters to the evaporator,
wherein the gap and the end portions of the plurality of tube-shaped transporters are not occluded by the evaporator,
wherein each end portion of the end portions of the plurality of tube-shaped transporters, includes an inclined portion in a form of a V shape with respect to the length direction of the plurality of tube-shaped transporters.

18. A cooling device, comprising:
a vessel having a refrigerant sealed inside and formed with a top plate and a bottom plate;
an evaporator inside the vessel, the evaporator provided with a plurality of columnar members extending from the bottom plate to contact the top plate, to receive heat to evaporate a liquid phase of the refrigerant as a liquid-phase refrigerant in a groove between the plurality of columnar members;
a condenser that dissipates heat to condense a vapor phase of the refrigerant inside the vessel;
a plurality of tube-shaped transporters arranged adjacent to each other in a width direction of the vessel, so that the plurality of tube-shaped transporters is to transport the liquid-phase refrigerant inside the vessel to the evaporator by capillary action; and
a gap generator that forms a gap between end portions in a length direction of the plurality of tube-shaped transporters,
wherein the plurality of tube-shaped transporters oppose the plurality of columnar members of the evaporator, so that the liquid-phase refrigerant is to move from the plurality of tube-shaped transporters to the evaporator,
wherein the gap and the end portions of the plurality of tube-shaped transporters are not occluded by the evaporator,
wherein the evaporator is outside the plurality of tube-shaped transporters to receive the heat to evaporate the refrigerant in the liquid phase that flows out from the end portions of the plurality of tube-shaped transporters in the groove between the plurality of columnar members, with the gap between the end portions of the plurality of tube-shaped transporters and side faces of the plurality of columnar members of the evaporator, so that the liquid-phase refrigerant is moveable from the plurality of tube-shaped transporters to the evaporator.

\* \* \* \* \*